United States Patent [19]

Nest et al.

[11] Patent Number: 4,719,362
[45] Date of Patent: Jan. 12, 1988

[54] ELECTRONIC PROXIMITY SWITCH DEPENDENT UPON A MAGNETIC FIELD

[75] Inventors: Andreas Nest, Herne; Jens Müller, Radevormwald, both of Fed. Rep. of Germany

[73] Assignee: Werner Turck GmbH & Co., KG, Halver, Fed. Rep. of Germany

[21] Appl. No.: 914,675

[22] Filed: Oct. 2, 1986

[30] Foreign Application Priority Data

Oct. 2, 1985 [DE] Fed. Rep. of Germany ....... 3535123
Dec. 18, 1985 [DE] Fed. Rep. of Germany ....... 3544809

[51] Int. Cl.$^4$ ...................... H01H 36/00; G08B 13/26
[52] U.S. Cl. .................................... 307/116; 324/207; 324/236; 331/65
[58] Field of Search ............ 307/116, 125, 126, 141.4, 307/143; 324/236, 207, 327; 331/65; 338/321; 340/551

[56] References Cited

U.S. PATENT DOCUMENTS

| | | |
|---|---|---|
| 3,458,774 | 7/1969 | Garshelis ............................... 307/116 |
| 3,743,853 | 7/1973 | Dittman et al. ...................... 307/116 |
| 3,919,629 | 11/1975 | Scruggs ............................ 331/65 X |
| 3,935,542 | 1/1976 | Buck ...................................... 331/65 |
| 4,433,309 | 2/1984 | Hermle et al. ........................ 331/65 |
| 4,455,528 | 6/1984 | Walker ............................ 331/65 X |
| 4,553,040 | 11/1985 | Trüper et al. ........................ 307/116 |
| 4,583,006 | 4/1986 | Okada et al. ........................ 307/116 |
| 4,618,823 | 10/1986 | Dahlheimer et al. ............. 331/65 X |

FOREIGN PATENT DOCUMENTS

| | | |
|---|---|---|
| 1175327 | 10/1964 | Fed. Rep. of Germany . |
| 3045848 | 7/1982 | Fed. Rep. of Germany ...... 307/116 |
| 0032131 | 2/1982 | Japan .................................. 307/116 |

*Primary Examiner*—William M. Shoop, Jr.
*Assistant Examiner*—Sharon D. Logan
*Attorney, Agent, or Firm*—Antonelli, Terry & Wands

[57] ABSTRACT

A magnetic field dependent electronic proximity switch adapted to be operated by a magnetic trigger, with the switch comprising an HF tank circuit of an oscillator circuit, which tank circuit can be acted upon by the magnetic trigger, the coil arrangement of the oscillator circuit exhibiting a tank circuit coil and a coupling coil and being associated with a magnetizable member which, starting with a specific magnetic field strength is drivable into magnetic saturation by an external magnetic field of the magnetic trigger with undamping of the tank circuit. The magnetizable member includes an amorphous or predominantly amorphous metal band, with the coil arrangement being disposed on a joint bobbin and the metal band being fashioned as a linear strip member or a slotted ring having an opening on a response side of the proximity switch.

16 Claims, 12 Drawing Figures

ELECTRONIC PROXIMITY SWITCH DEPENDENT UPON A MAGNETIC FIELD

BACKGROUND OF THE INVENTION

The present invention relates to a switch arrangement and, more particularly, to an electronic proximity switch dependent upon a magnetic field operated by an approaching magnetic trigger, with an HF tank circuit of an oscillator circuit which can be acted upon by the magnetic trigger, and with a coil arrangement of the oscillator circuit, including a tank circuit coil and coupling coil, being associated with a magnetic member which latter, starting with a specific magnetic field strength, can be driven into magnetic saturation by the external magnetic field of the magnetic trigger with undamping of the tank circuit.

In, for example, Auslegeschrift No. 1 175 327, a proximity switch is proposed which includes an oscillator circuit wherein a permeable metal plate is disposed between the tank circuit coil and the feedback coil, with the metal plate extensively shielding the tank circuit coil with respect to the coupling coil so that only greatly damped oscillations occur. By the approach of the permanent-magnet trigger, the metal plate in this arrangement can be driven into saturation whereby the shielding effect of the plate is reduced in a step- or jump-like fashion and, consequently, a marked undamping of the tank circuit results. This effect is exploited for operating an electronic switch.

Since the tank circuit, in the basic condition, is greatly damped, that is, does not transmit an output signal, flaws in the electronic circuit, leading in all cases to a loss of signal but not to excitation, cannot erroneously be transformed into a switching signal. However, the conventional proximity switch shows low response sensitivity for its structural size and, for this reason, it cannot be triggered when fashioned of a compact size, for example, with a space requirement of merely 1 cubic centimeter, through impermeable metallic walls of, for example, aluminum or austenitic steel.

The aim underlying the present invention essentially resides in providing a proximity switch of the aforementioned type having a small structural size and a high response sensitivity.

In accordance with the present invention, a magnetizable member includes an amorphous or predominantly amorphous metal band, with the tank circuit coil and coupling coil being seated on a joint bobbin. Amorphous metal, also called metallic glass in the United States and sold in Germany under the trademark "VITROVAC", is a material exhibiting high permeability but having an electrical conductivity which is low as compared with transformer plates or dynamo sheets.

In accordance with the present invention, the tank circuit, in the basic condition, is greatly damped and is suddenly excited to strong oscillations by an approaching magnetic trigger, resulting, even with a small structural size, in a high response sensitivity. Since the tank circuit coil and the coupling coil are arranged on a joint bobbin, the magnetic trigger, however, affects the coupling characteristics between the two coils either not at all or only to a negligible extent. The decisive factor, in spite of the relatively low electrical conductivity of the amorphous metal band, is the induction of very strong eddy currents in the amorphous metal band. The metal band in the basic condition, appears to bind the HF tank circuit field so closely to itself, due to the high permeability thereof that large eddy current losses occur.

Upon the approach of the magnetic trigger, the magnetic field of the latter is likewise attracted in a special manner by the amorphous metal band so that this field is quickly driven into saturation. The strong undamping of the tank circuit observed under practical conditions, however, is surprising since it is to be expected that, upon a decrease of the permeability of the amorphous metal band, the inductance of the tank circuit would decrease and, thus, the resonant frequency would rise and, consequently, there should be actually an increase in the eddy current losses.

In any event, in practice, a very pronounced change-over of the damping condition can be observed. Additional advantages in using an amorphous metal band are good viscoelastic properties rendering the proximity switch insensitive, in particular, against vibrations and shocks, as well as the fact that the characteristic values are independent from temperature fluctuations, thereby permitting use of a sensor head in a temperature range of between $-50°$ C. and $+150°$ C. without temperature compensation.

In accordance with advantageous features of the present invention, the amorphous metal band can be fashioned as a straight thin strip arranged along an axis of the coil arrangement and passing through a ring or torus of the coil thereby making it possible to obtain very high response sensitivities, increasing with an increasing length of the amorphous metal band. Even at a band length of about 1 centimeter, response distances can be attained of about 10 centimeters.

Preferably, the proximity switch of the present invention is operated by a trigger moving along the proximity switch, the amorphous metal band can have the shape of an inherently or substantially closed ring or oval, with the ring or oval, respectively, passing through the coil axis and encompassing the coil ring or torus. In conventional proximity switches such as, for example, reed contacts, there is the problem of multiple triggering during movement of the trigger along the proximity switch. By fashioning the amorphous metal band in the form of an inherently or substantially closed ring or oval, only a single switching step occurs, in contrast to the conventional proximity switch, while the magnetic trigger is moved along the arrangement. Additionally, with such a transverse movement of the magnetic trigger, the switching zone is narrowly limited so that a very accurate positional detection of the magnetic trigger is ensured. Furthermore, by a simple deformation of the annular metal band, the characteristic data of the proximity switch can be influenced within certain limits. In this connection, it is advantageous that the amorphous metal band does not incur any change in its magnetic property by bending or similar deformations.

In accordance with further advantageous features of the present invention, it is possible to provide two or more inherently closed annular or oval metal bands distributed along the ring or torus of the coil thereby making it possible to affect the characteristic data of a proximity switch. A particular advantage resides in an enlargement of the response range upon movement of the magnetic trigger toward the proximity switch, whereas, the response zone remains still very narrow with respect to a transverse movement of the trigger.

According to the present invention, the metal band may have a thickness of between 15 $\mu$m and 50 $\mu$m, preferably being about 30 $\mu$m, and a width of 1 to 3 millimeters. Furthermore, according to the present invention, a diameter of the ring may be on the order of 2 to 10 millimeters. In spite of the small structural sizes, the proximity switch of the present invention readily attains very high response sensitivities.

Advantageously, according to the present invention, the amorphous metal band is fashioned as a U- or C-shaped arc section, with an opening thereof lying on a response side of the proximity switch. Preferably, a very narrow far-reaching parabola-shaped response zone is created thereby especially avoiding the creation of secondary response zones. Such a proximity switch is readily employable for a great variety of different sensitivity ranges and makes it unnecessary to inventory or warehouse various types of proximity switches. A crest of an arcuate section of the substantially U- or substantially C-shaped arc sections is, advantageously located in the coil ring or torus whereby an exactly symmetrical response zone is produced.

According to further features of the present invention, the width of the opening of the arc section can be approximately the same as or smaller than an axial dimension of the coil ring or torus. An embodiment especially favorable from a manufacturing viewpoint results with an annular configuration of the arc section and a ring having an opening width which is approximately equal to or smaller than a radius of the arc section. With a radius of about 3 millimeters for the annular arc section, the opening width is preferably about 2.5 millimeters.

Alternatively, according to the present invention, the crest of the arc section lies on the end face of the coil ring or torus opposite to the response side, and the arc section embraces, with lateral legs thereof, half of the coil ring or torus.

The above and other objects, features, and advantages of the present invention will become more apparent from the following description when taken in connection with the accompanying drawings which show, for the purpose of illustration only, several embodiments in accordance with the present invention.

BACKGROUND OF THE INVENTION

Figure 1:
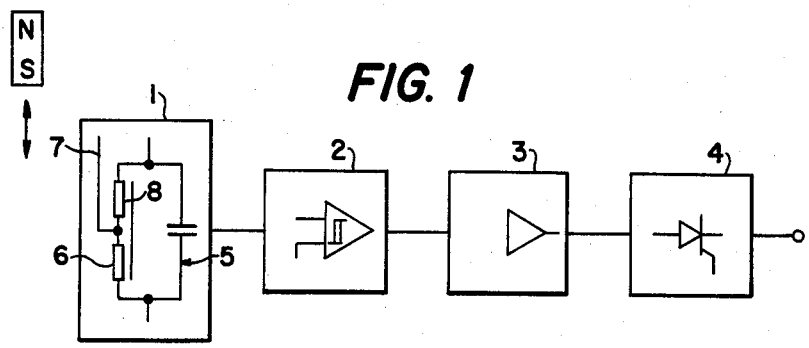
FIG. 1 is a block circuit diagram of a proximity switch constructed in accordance with the present invention.

Referring now to the drawings wherein like reference numerals are used throughout the various views to designate like parts and, more particularly, to FIG. 1, according to this figure, an electronic proximity switch includes an oscillator section 1, an evaluating stage 2, a switching amplifier 3, and a switching member 4, with the switching member 4 comprising a switching transistor or, preferably, a thyristor. The oscillator section 1 comprises an HF tank circuit 5, with a tank circuit coil 6 having a tap 7. Accordingly, a portion of the tank circuit coil 6 is provided with the function of a coupling coil 8, and thus the oscillator section 1 can be operated, for example, as a so-called Hartley circuit.

Figure 2:
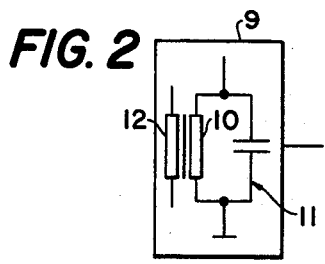
FIG. 2 is a schematic view of an embodiment of an oscillator section of a proximity switch constructed in accordance with the present invention.

Alternatively, as shown in FIG. 2, it is also possible to utilize an oscillator section 9 wherein the tank circuit coil 10 of an HF tank circuit 11 is associated with a coupling coil 12 so that the oscillator section 9 can be operated, for example, in a so-called Meissner circuit.

Figure 3:
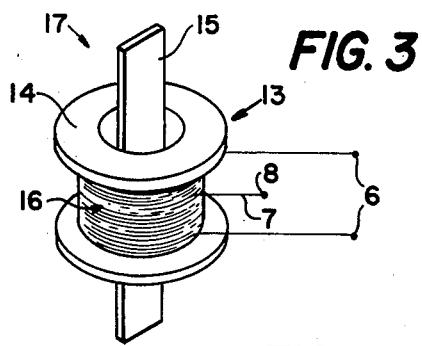
FIG. 3 is a perspective view of a coil arrangement of the oscillator section of FIG. 2 with a linear amorphous metal band.

FIG. 3 provides an illustration of a coil arrangement generally designated by the reference numeral 13 with a tank circuit coil 6 having a tap 7 in correspondence with the construction described hereinabove in connection with FIG. 1. The tank circuit coil 6 and winding portion, acting as a coupling coil 8, are arranged on a joint bobbin 14. An amorphous metal band 15 is disposed along a longitudinal center axis of the coil arrangement 13, with the metal band 15 being fashioned as a linear thin strip axially penetrating or extending through the coil ring or torus generally designated by the reference numeral 16. The coil arrangement 13 and the amorphous metal band 15 jointly form a sensor head generally designated by the reference numeral 17 of a proximity switch having a high response sensitivity.

Figure 4:
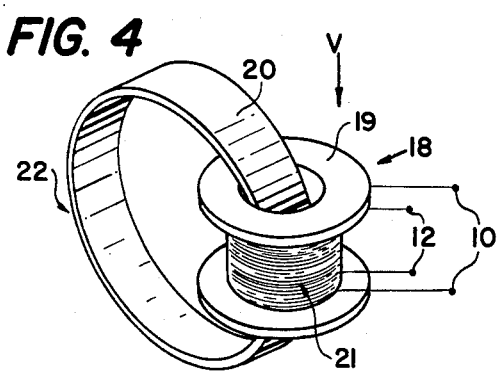
FIG. 4 is a perspective view of a coil arrangement of the oscillator section of FIG. 1 with a ring-shaped amorphous metal band.

The coil arrangement of FIG. 4 includes a coil arrangement generally designated by the reference 18 having a tank circuit coil 10 and a coupling coil 12 corresponding to that of FIG. 2, wound on a joint bobbin 19 and exhibiting a closed inductive coupling. The coil arrangement 18 is associated with an amorphous metal band 20 shaped as an inherently closed ring passing through a longitudinal center axis of the coil arrangement 18 and looping around a coil ring or torus generally designated by the reference 21. The ring-shaped metal band 20 may be produced, for example, of a strip section, the ends of which are magnetically conductively joined by, for example, spot welding. The coil arrangement 18 and metal band 20 together form a sensor head generally designated by the reference numeral 22. As can readily be appreciated, the coil arrangement 13 of FIG. 3 can also be used in conjunction with a ring-shaped metal band 20 such as illustrated in FIG. 4 and, respectively, the coil arrangement 18 of FIG. 4 can be used in association with a linear metal band 15 such as shown in FIG. 3.

Figure 5:
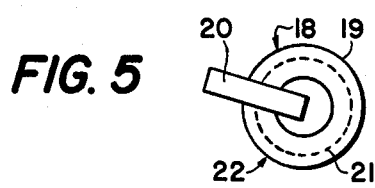
FIG. 5 is a view of a sensor head including a coil arrangement and an annular metal band taken in the direction of the arrow V in FIG. 4.
Figure 6:
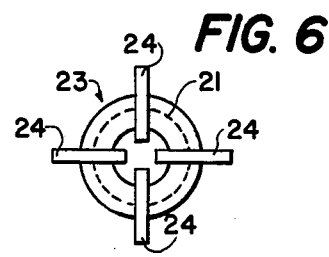
FIG. 6 is a plan view of an alternative embodiment of a sensor head constructed in accordance with the present invention with several annular metal bands.

FIG. 6 provides an example of a sensor head generally designated by the reference numeral 23 with a coil arrangement 18 of FIGS. 4 and 5, and with several annular metal bands 24 distributed along the coil ring or torus 21.

In all three embodiments described hereinabove, the metal bands have a thickness of between 15 μm and 50 μm, and, preferably, a thickness of 30 μm, and a width of 1 to 3 millimeters and, with several metal bands 24, also of 1 millimeter. In the embodiments of FIGS. 4–6, the ring diameter is in a range of 2 to 10 millimeters.

Figure 8:
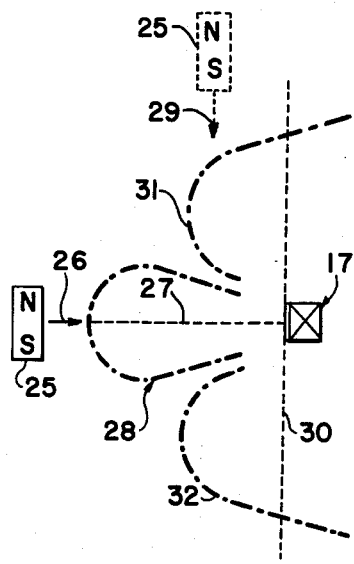
FIG. 8 is a schematic view depicting a response range of a proximity switch utilizing a sensor head constructed in accordance with FIG. 3.

As shown in FIG. 8, a proximity switch includes a sensor head generally designated by the reference numeral 17 having a linear amorphous metal band 15, with the switch being especially suitable for cases where a high switching distance is to be attained. A permanent-magnet trigger 25, or an electromagnet, is, in FIG. 8, moved toward the sensor head 13 frontally in a direction of the arrow 26, that is, in parallel to an axis 27 of the sensor head 13, with a switching operation coming about upon entrance into a response zone 28 illustrated in phantom lines.

Upon a movement of the trigger 25 transversely of the sensor axis 27 of the sensor head 13 in a direction of the arrow 29, in a zone or area near a plane 30 passing through an active side of the sensor head 13, multiple triggering occurrences arise because, in addition to the central response zone 28, there are further relatively small lateral response zones 31, 32 which, however, still lie markedly in front of the plane 30. Moreover, the response zones 28, 31, 32 are relatively broad with respect to their transverse extension so that an accurate location of the trigger 25 upon a transverse movement may create problems.

Figure 9:
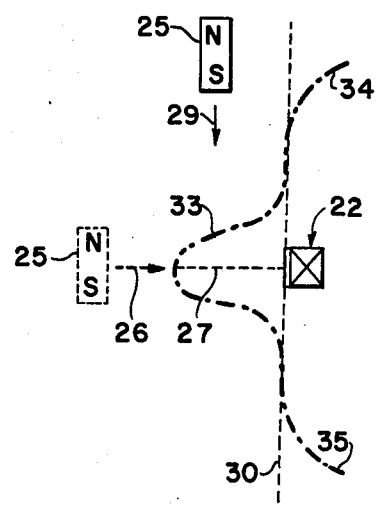
FIG. 9 is a schematic view depicting a response range of a proximity switch with a sensor head constructed in accordance with FIGS. 4 and 5.

The problem of multiple triggering, also known from conventional proximity switches such as, for example, with reed contacts, can be completely avoided by a proximity switch such as illustrated in FIG. 9 which includes a sensor head 22 equipped with an annular metal band 20, since such a proximity switch merely has a narrow parabolic or lance-shaped response zone 33 disposed directly in front of the sensor head 22, whereas, the secondary response zones 34, 35 lie almost entirely behind the plane 30 of the sensor head 22. With a lateral sweep transverse to the sensor axis 27, only a single off-on-off switching process occurs even in a situation wherein the trigger 25 very closely approaches the plane 30 of the sensor 22, thereby providing a very accurate detection of the position of the trigger in an area of the response zone 33.

Figure 7:
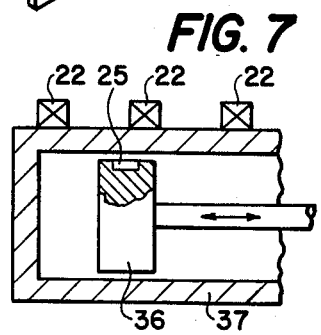
FIG. 7 is a partial cross-sectional view of a measuring unit for detecting a position of a piston utilizing sensor heads constructed in accordance with FIGS. 4 and 5.

Consequently, proximity switches having sensor heads 22 are especially suited for detecting, for example, as shown in FIG. 7, a position of pistons 36. In this connection, as shown in FIG. 7, several sensor heads 22 can be arranged on a wall of a metallic, impermeable cylinder 37, with the sensor heads 22 detecting a position of the magnetic trigger 25 attached to the piston 36. Since a spacing between the sensor head 22 and the trigger 25 can be very small, the sensor heads 22 may, if necessary, also be set flush into the cylinder 37.

Figure 10:
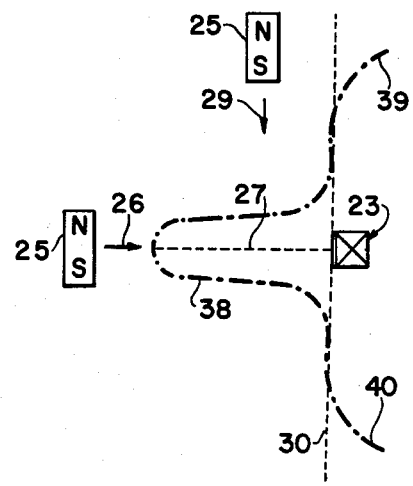
FIG. 10 is a schematic view depicting a response range of a proximity switch with a sensor head constructed in accordance with FIG. 6.

FIG. 10 provides an illustration of a range of application of a proximity switch employing the sensor head 23 which includes several annular metal bands 24. By utilization of the sensor head 23, a central parabolic or lance-shaped response zone 38 is produced which, as compared with the embodiment of FIG. 9, is enlarged or elongated in the direction of the axis of the sensor head 23. However, the lateral response zones 39, 40 lie completely behind the plane 30 of the sensor head 23 thereby making the sensor head 23 equally suitable for all approach directions of the trigger 25. In many practical applications, it is sufficient even with an approach in parallel to the axis 27 of the sensor head 23 to provide a shorter response distance on the order of 1 centimeter or less so that here, too, a sensor head 22 with only one annular metal band is universally usable.

Figure 11:
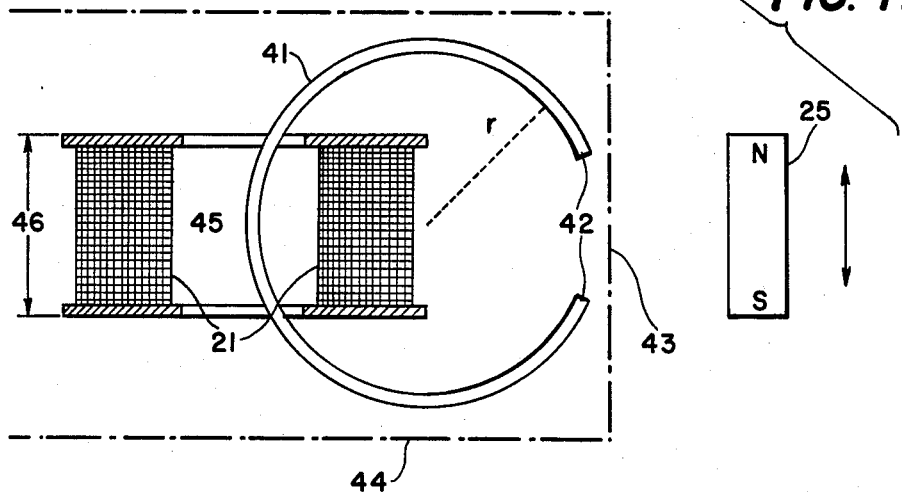
FIG. 11 is a partial cross-sectional schematic view of another embodiment of a proximity switch constructed in accordance with the present invention employing an approximately C-shaped amorphous metal band.

FIG. 11 provides an illustration of a proximity switch wherein an amorphous metal band is fashioned as a substantially C-shaped arcuate section 41 bent into a ring shape, with an opening 42 thereof lying on a response side 43 of the proximity switch. The coil and arcuate section 41 can be cast into a synthetic resin to stabilize their relative positions. The phantom line 44 designates the outer contours of the sensor head of the proximity switch. A crest 45 of the arcuate section 41 lies in the aperture of the coil ring or torus 21, with a width of the arc section opening 42 being somewhat smaller than the axial dimension 46 of the coil ring or torus 21. The sensor head of FIG. 11 may be constructed very compactly and, for example, may have a diameter r of 3 millimeters of the ring-shaped arc section 41, and a width of the opening of about 2.5 millimeters.

Figure 12:
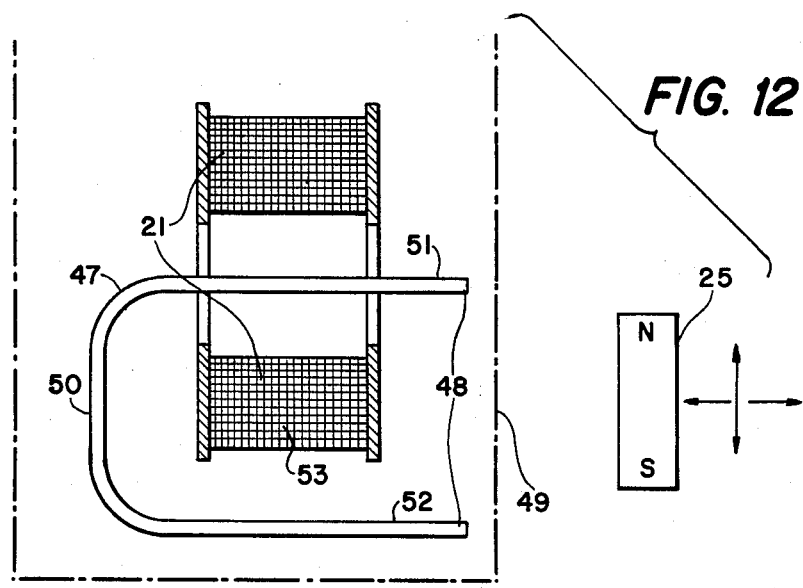
FIG. 12 is a partial cross-sectional schematic view of yet another embodiment of a proximity switch constructed in accordance with the present invention utilizing an approximately U-shaped amorphous metal band.

In FIG. 12, the amorphous metal band is fashioned as a substantially U-shaped arc section 47, with an opening 48 being oriented toward a response side 49, and with the latter being provided laterally of the sensor head. A crest 50 of the arc section 47 lies on an end face of the coil ring or torus 21 in opposition to the response side 49, and the arc section 47 embraces one-half of the coil ring or torus 53 with two lateral legs 51, 52 thereof.

In the embodiment of FIGS. 11 and 12, the narrow response zone 38 illustrated in FIG. 10 results in an especially concise manner, and such response zone 38 can reach a width of above 30 millimeters in the examples of FIGS. 11, 12. The secondary response zones 39, 40 are located clearly behind the sensor plane 30 so that the problems of multiple triggering are safely avoided.

While we have shown and described several embodiments in accordance with the present invention, it is understood that the same is not limited thereto but is susceptible to numerous changes and modifications as known to one of ordinary skill in the art, and we therefore do not wish to be limited to the details shown and described herein, but intend to cover all such modifications as are encompassed by the scope of the appended claims.

We claim:

1. An electronic proximity switch dependent upon a magnetic field and adapted to be operated by an approaching magnetic trigger means, the electronic proximity switch including an HF tank circuit means adapted to be acted upon by the magnetic trigger means and associated with an oscillator circuit means having a coil arrangement including a tank circuit coil means and a coupling coil means, being associated with a magnetizable member which, starting with a specific magnetic field strength, can be driven into a magnetic saturation by an external magnetic field of the magnetic trigger means with an undamping of the tank circuit means, wherein the magnetizable member includes a predominantly amorphous metal band, and wherein the tank coil means and the coupling coil means are seated on a joint bobbin means.

2. An electronic proximity switch dependent upon a magnetic field and adapted to be operated by an approaching magnetic trigger means, the electronic proximity switch including an HF tank circuit means adapted to be acted upon by the magnetic trigger means and associated with an oscillator circuit means having a coil arrangement including a tank circuit coil means and a coupling coil means, being associated with a magnetizable member which, starting with a specific magnetic field strength, can be driven into a magnetic saturation by an external magnetic field of the magnetic trigger means with an undamping of the tank circuit means, wherein the magnetizable member includes a predominantly amorphous metal band, said amorphous metal band is fashioned as a linear thin strip arranged along an axis of the coil arrangement and passing through a torus of the coil arrangement, and wherein the tank coil means and the coupling coil means are seated on a joint bobbin means.

3. An electronic proximity switch dependent upon a magnetic field and adapted to be operated by an approaching magnetic trigger means, the electronic proximity switch including an HF tank circuit means adapted to be acted upon by the magnetic trigger means and associated with an oscillator circuit means having a coil arrangement including a tank circuit coil means and a coupling coil means, being associated with a magnetizable member which, starting with a specific magnetic field strength, can be driven into a magnetic saturation by an external magnetic field of the magnetic trigger means with an undamping of the tank circuit means, wherein the magnetizable member includes a predominantly amophous metal band, and wherein the tank coil means and the coupling coil means are seated on a joint bobbin means, and wherein the trigger means activates a switch by moving along a proximity thereof, wherein the amorphous metal band is an inherently closed member in the shape of one of a ring or oval, with a portion thereof passing through an axis of the coil arrangement and looping around a torus of the coil arrangement.

4. An electronic switch according to claim 3, wherein at least two inherently closed members are provided and are arranged along the torus of the coil arrangement.

5. An electronic switch according to claim 1, 2, 3, or 4, wherein the metal band has a thickness of between 15 $\mu$m and 50 $\mu$m, and a width in the range of 1 to 3 millimeters.

6. An electronic switch according to claim 5, wherein the metal band has a thickness of 30 $\mu$m.

7. An electronic switch according to claim 6, wherein the inherently closed member has a diameter in the range of 2 to 10 millimeters.

8. An electronic proximity switch dependent upon a magnetic field and adapted to be operated by an approaching magnetic trigger means, the electronic proximity switch including an HF tank circuit means adapted to be acted upon by the magnetic trigger means and associated with an oscillator circuit means having a coil arrangement including a tank circuit coil means and a coupling coil means, being associated with a magnetizable member which, starting with a specific magnetic field strength, can be driven into a magnetic saturation by an external magnetic field of the magnetic trigger means with an undamping of the tank circuit means, wherein the magnetizable member includes a predominantly amorphous metal band, and wherein the tank coil means and the coupling coil means are seated on a joint bobbin means, and wherein the amorphous metal band has a substantially U-shaped arcuate section, and wherein an opening of the amorphous metal band lies on a response side of the proximity switch.

9. An electronic switch according to claim 8, wherein a crest of the arcuate section lies in a torus of the coil arrangement.

10. An electronic switch according to claim 8 or 9, wherein a width of the opening in the amorphous metal band is at least equal to or less than an axial direction of a torus of the coil arrangement.

11. An electronic switch according to claim 10, wherein the arcuate section is bent into a ring shape, and the width of the opening is approximately equal to or less than a radius of the arcuate section.

12. An electronic switch according to claim 11, wherein the radius is about 3 millimeters, and a width of the opening is about 2.5 millimeters.

13. An electronic switch according to claim 8, wherein a crest of the arcuate section lies along an end face of a torus of the coil arrangement in opposition to the response side of the switch, and wherein lateral legs of the arcuate section embrace one-half of a torus of the coil arrangement.

14. An electronic switch according to claim 3 or 4, wherein a diameter of the inherently closed member is in the range of 2 to 10 millimeters.

15. An electronic proximity switch dependent upon a magnetic field and adapted to be operated by an approaching magnetic trigger means, the electronic proximity switch including an HF tank circuit means adapted to be acted upon by the magnetic trigger means and associated with an oscillator circuit means having a coil arrangement including a tank circuit coil means and a coupling coil means, being associated with a magnetizable member which, starting with a specific magnetic field strength, can be driven into a magnetic saturation by an external magnetic field of the magnetic trigger means with an undamping of the tank circuit means, wherein the magnetizable member includes a predominantly amorphous metal band, and wherein the tank coil means and the coupling coil means are seated on a joint bobbin means, and wherein the amorphous metal band is fashioned as a C-shaped arcuate section, and wherein an opening of the C-shaped arcuate section lies on a response side of the proximity switch.

16. An electronic switch according to claim 15, wherein a crest of the arcuate section lies along an end face of a torus of the coil in opposition to a response side of the proximity switch, and wherein lateral legs of the arcuate section embrace one-half of the torus of the coil arrangement.

* * * * *